(12) United States Patent
Seddon

(10) Patent No.: US 11,387,145 B2
(45) Date of Patent: Jul. 12, 2022

(54) JET ABLATION DIE SINGULATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/950,097

(22) Filed: Nov. 17, 2020

(65) Prior Publication Data

US 2021/0074586 A1 Mar. 11, 2021

Related U.S. Application Data

(63) Continuation-in-part of application No. 16/807,438, filed on Mar. 3, 2020, now Pat. No. 11,043,422, which is a continuation of application No. 16/136,026, filed on Sep. 19, 2018, now Pat. No. 10,607,889.

(51) Int. Cl.
| | |
|---|---|
| *H01L 21/78* | (2006.01) |
| *H01L 21/3065* | (2006.01) |
| *H01L 21/56* | (2006.01) |
| *H01L 23/31* | (2006.01) |
| *H01L 21/304* | (2006.01) |

(52) U.S. Cl.
CPC .......... *H01L 21/78* (2013.01); *H01L 21/3046* (2013.01); *H01L 21/3065* (2013.01); *H01L 21/561* (2013.01); *H01L 23/3171* (2013.01)

(58) Field of Classification Search
CPC ... H01L 21/78; H01L 21/3065; H01L 21/561; H01L 23/3171; H01L 21/3046; H01L 2221/68327; H01L 2221/6834; H01L 2221/68368; H01L 21/6836
USPC ........................................................ 438/460
See application file for complete search history.

(56) References Cited

U.S. PATENT DOCUMENTS

| | | | | |
|---|---|---|---|---|
| 9,219,011 | B2 * | 12/2015 | Engelhardt | ......... H01L 21/6835 |
| 9,337,098 | B1 | 5/2016 | Seddon et al. | |
| 10,083,867 | B2 * | 9/2018 | Sandoh | ............... H01L 21/3065 |
| 10,607,889 | B1 | 3/2020 | Seddon | |
| 2003/0189212 | A1 | 10/2003 | Yoo | |
| 2015/0091124 | A1 | 4/2015 | Liu et al. | |

* cited by examiner

*Primary Examiner* — Vu A Vu
(74) *Attorney, Agent, or Firm* — Adam R. Stephenson, Ltd.

(57) ABSTRACT

Implementations of a method of singulating a plurality of semiconductor die may include forming an opening in a layer of passivation material coupled to a second side of a semiconductor substrate; etching substantially through a thickness of the semiconductor substrate at the opening in the layer of passivation material to form etched sidewalls along the thickness at a plurality of die streets; and jet ablating one or more portions of the layer of passivation material that overhangs the etched sidewalls.

19 Claims, 4 Drawing Sheets

JET ABLATION DIE SINGULATION SYSTEMS AND RELATED METHODS

CROSS REFERENCE TO RELATED APPLICATIONS

This application is a continuation-in-part application of the earlier U.S. Utility Patent Application to Michael Seddon entitled "Jet Ablation Die Singulation Systems and Related Methods," application Ser. No. 16/807,438, filed Mar. 3, 2020, now pending, which application is a continuation application of the earlier U.S. Utility Patent Application to Michael Seddon entitled "Jet Ablation Die Singulation Systems and Related Methods," application Ser. No. 16/136,026, filed Sep. 19, 2018, now U.S. Pat. No. 10,607,889, issued Mar. 31, 2020, the disclosures of each of which are hereby incorporated entirely herein by reference.

BACKGROUND

1. Technical Field

Aspects of this document relate generally to systems and methods used for singulating substrates. More specific implementations involve semiconductor substrates.

2. Background

Semiconductor substrates are used to form a wide variety of semiconductor devices. The semiconductor devices are generally distributed across a planar surface of the semiconductor substrate in a plurality of die. The plurality of die are separated from one another using a singulation process like sawing.

SUMMARY

Implementations of a method of singulating a plurality of semiconductor die may include forming an opening in a layer of passivation material coupled to a second side of a semiconductor substrate; etching substantially through a thickness of the semiconductor substrate at the opening in the layer of passivation material to form etched sidewalls along the thickness at a plurality of die streets; and jet ablating one or more portions of the layer of passivation material that overhangs the etched sidewalls.

Implementations of a method of singulating a plurality of semiconductor die may include one, all, or any of the following:

Forming an opening in the layer of passivation material further may include one of etching or jet ablating.

Jet ablating one or more portions of the layer of passivation material may further include jet ablating from the second side of the semiconductor substrate.

Jet ablating one or more portions of the layer of passivation material may further include jet ablating from the first side of the semiconductor substrate.

Etching substantially through the thickness of the semiconductor substrate may further include plasma etching.

The thickness of the semiconductor substrate may be less than 50 microns.

The thickness of the semiconductor substrate may be 25 microns.

The method may include jet ablating one or more portions of the layer of passivation material after etching substantially through the thickness of the semiconductor substrate.

Implementations of a method of singulating a plurality of semiconductor die may include forming a pattern in a back metal layer coupled on a first side of a semiconductor substrate, the semiconductor substrate including a plurality of semiconductor die; etching substantially through a thickness of the semiconductor substrate at the pattern in the back metal layer to form a plurality of sidewalls across the thickness; forming an opening in a layer of passivation material coupled to a second side of the semiconductor substrate; and jet ablating one or more portions of the passivation layer overhanging the plurality of sidewalls.

Implementations of a method of singulating a plurality of semiconductor die may include one, all, or any of the following:

Forming an opening in the layer of passivation material may further include one of etching or jet ablating.

Jet ablating one or more portions of the layer of passivation material may further include jet ablating from the second side of the semiconductor substrate.

Jet ablating one or more portions of the layer of passivation material may further include jet ablating from the first side of the semiconductor substrate.

Etching substantially through the thickness of the semiconductor substrate may further include plasma etching.

The thickness of the semiconductor substrate may be less than 50 microns.

The thickness of the semiconductor substrate may be 25 microns.

The method may include jet ablating one or more portions of the layer of passivation material after forming the opening in the passivation layer.

Implementations of a method of singulating a plurality of semiconductor die, the method may include mounting a semiconductor substrate to a tape; etching substantially through a thickness of the semiconductor substrate at a plurality of die streets to form etched sidewalls along the thickness; and jet ablating one or more portions of a layer of passivation material that overhangs the etched sidewalls.

Implementations of a method of singulating a plurality of semiconductor die may include one, all, or any of the following:

Etching substantially through the thickness may further include plasma etching.

Jet ablating one or more portions of the layer of passivation material may further include jet ablating from a second side of the semiconductor substrate.

Jet ablating one or more portions of the layer of passivation material may further include jet ablating from a first side of the semiconductor substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended jet ablation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such jet ablation systems and related methods, and implementing components and methods, consistent with the intended operation and methods.

For semiconductor die that are less than 50 microns in thickness, particular processing challenges exist. Die handling, die strength, and performing processing operations with the die all present specific challenges, as die and wafer breakage can significantly reduce yield and/or affect device reliability. Die strength is negatively affected by traditional singulation options like sawing which induce die chipping and cracking along the die streets. These chips and cracks formed during the sawing process can eventually propagate during operation and reliability testing causing the die to fail.

Figure 1:
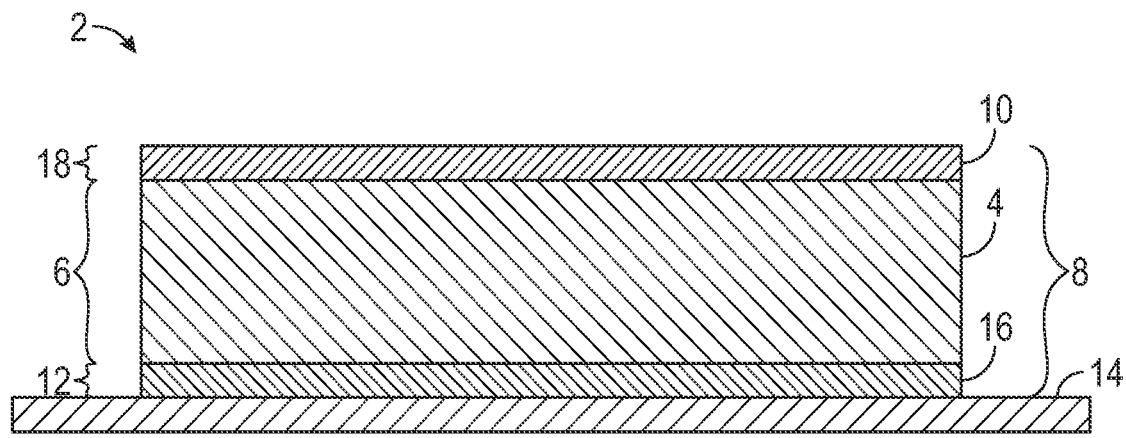
FIG. 1 is a side view of a semiconductor substrate with a passivation layer and a back metal layer thereon.

Referring to FIG. 1, in various implementations disclosed in this document, the semiconductor substrate 2 includes a plurality of semiconductor die 4 (two are subsequently illustrated in the drawings) that have been processed using a semiconductor fabrication process to form one or more semiconductor devices therein or thereon (not shown). Following the completion of the fabrication process (or during some portion of it, in some implementations), the semiconductor substrate 2 is thinned on a side of the semiconductor substrate 2 that is opposite the side on which the one or more semiconductor devices have been formed to a desired substrate thickness 6. The thinning process takes place using backgrinding, lapping, wet etching, any combination thereof, or any other technique for removing backside damage and/or the material of the semiconductor substrate 2 substantially uniformly across the largest planar surface of the substrate. The semiconductor substrate 4 may be in various implementations, by non-limiting example, single crystal silicon, polysilicon, amorphous silicon, glass, sapphire, ruby, gallium arsenide, silicon carbide, silicon-on-insulator, and any other semiconductor substrate type.

In various implementations, the thinning process may create an edge ring around the wafer (like that present in the TAIKO backgrinding process marketed by Disco Hi-Tec America, Inc. of Santa Clara, Calif.). The edge ring acts to structurally support the wafer following thinning so that no wafer carrier may need to be utilized during subsequent processing steps. In various implementations, the thinning process may be carried out after the semiconductor substrate 2 has been mounted to a backgrinding tape whether an edge ring is formed during backgrinding or not. A wide variety of backgrinding tapes may be employed in various implementations, including those that are compatible with subsequent plasma etching operations.

Following the thinning process, the various die 4 formed in the semiconductor substrate 2 need to be singulated from one another so they can be subsequently packaged into semiconductor packages. In various implementations, following the thinning process a back metal layer 10 is applied to the semiconductor die through, by non-limiting example, sputtering, evaporation, or another metal deposition process. In various implementations, the deposition process is conducted while the wafer is either supported by an edge ring or supported by the backgrinding tape. In other implementations, however, the substrate may be demounted from the backgrinding tape and mounted to another support tape for subsequent processing steps.

FIG. 1 illustrates an implementation of a semiconductor substrate 2 following the back metal deposition process and the thinning process. In various implementations, as illustrated, the substrate 2 is coupled with a tape 14 (which may be the backgrinding or other support tape in various implementations). In other implementations, however, at this stage in the process the wafer may not be coupled with a tape 14 (such as when an edge ring is being used). As illustrated, the one or more semiconductor die 4 (not yet separately visible) are covered by a layer of passivation material 16. In various implementations the passivation material 16 may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. Because of this, the term "passivation material" and "passivation layer," as used herein, includes any of the aforementioned materials whether the material was deposited to act as a passivating material or whether the material merely forms a non-plasma etchable portion or layer in the die street region.

As illustrated in FIG. 1, the total thickness 8 of the semiconductor substrate 2 is the additive thickness of the substrate thickness 6, the thickness 18 of the back metal 10, and the thickness 12 of the passivation material 16. In various implementations, thickness of the back metal may vary from between about 1 micron to about 15 microns. In particular implementations, the thickness of the back metal may be between about 1 micron to about 3 microns. In various implementations, the total thickness 8 of the semiconductor substrate 2 may be less than about 50 microns. In particular implementations, the total thickness 8 of the semiconductor substrate may be between about 25 microns to about 35 microns. In various implementations, the total thickness 8 may be about 25 microns.

Figure 2:
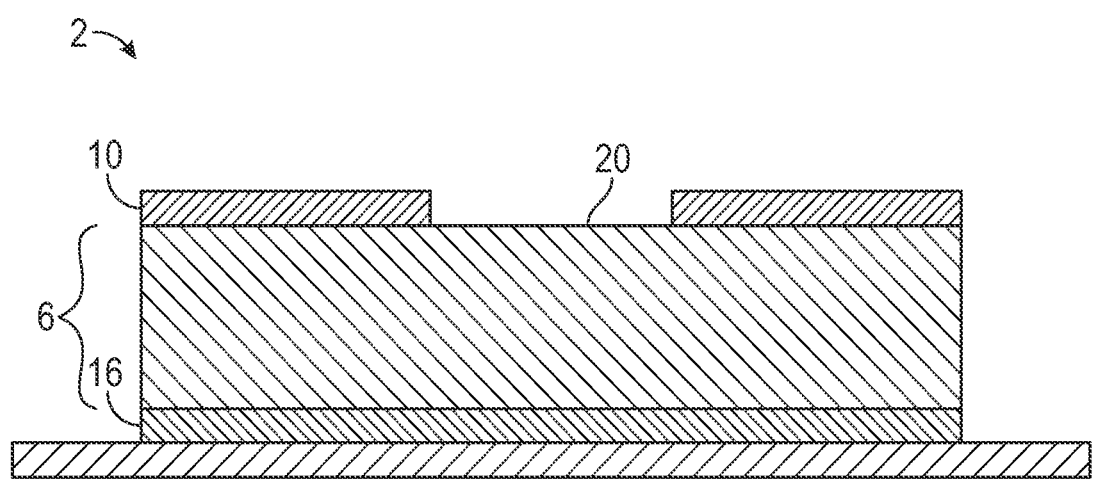
FIG. 2 is a side view of the substrate of FIG. 1 following patterning of the back metal layer.

Referring to FIG. 2, the substrate 2 is illustrated following patterning of the back metal layer 10. The patterning may be accomplished using any of a wide variety of photolithography processes involving the application of photoresist; exposure, development, then removal of the photoresist; etching of the back metal 10 using an appropriate etchant, and removal of the photoresist. With the substrate material exposed following etching and patterning of the back metal layer 10 in the patterned areas/die streets 20 of the back metal layer 10, the material of the substrate is ready for etching. In various implementations, the substrate material then be etched all the way down to or toward the passivation layer 16. In other implementations, however, the etching may be conducted partially through, or substantially through the thickness 6 of the substrate 2 down to or toward the passivation layer 16 (the etching may be carried out using a plasma etching processes in various implementations). Generally, the plasma etch chemistries used to etch the material of the substrate 2 do not etch the materials of the passivation layer or any metal structures in the street (electrical test/alignment features, etc.), leaving the plurality of semiconductor die still unsingulated after the etching of the substrate. The semiconductor die 4 following etching of the substrate 2 are illustrated in FIG. 3.

Figure 3:
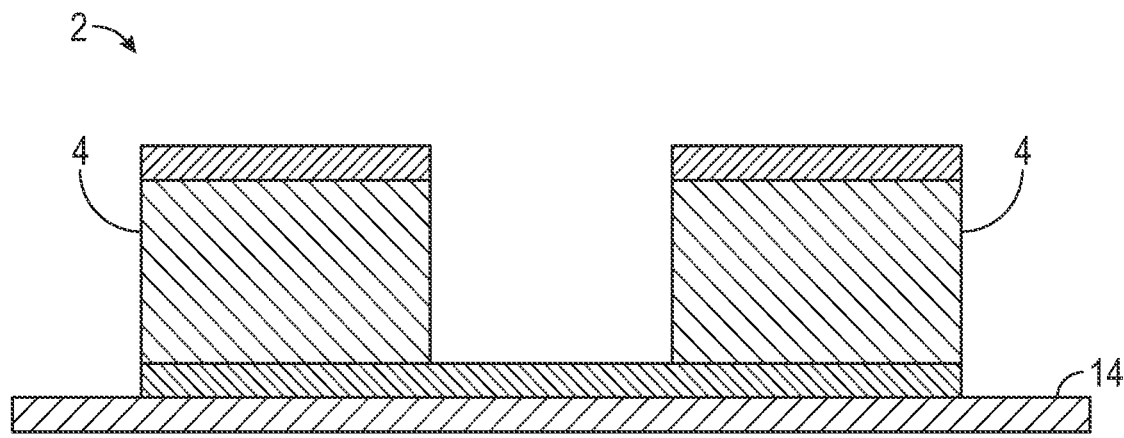
FIG. 3 is a side view of the substrate of FIG. 2 following etching of the substrate material down to the passivation layer.
Figure 4:
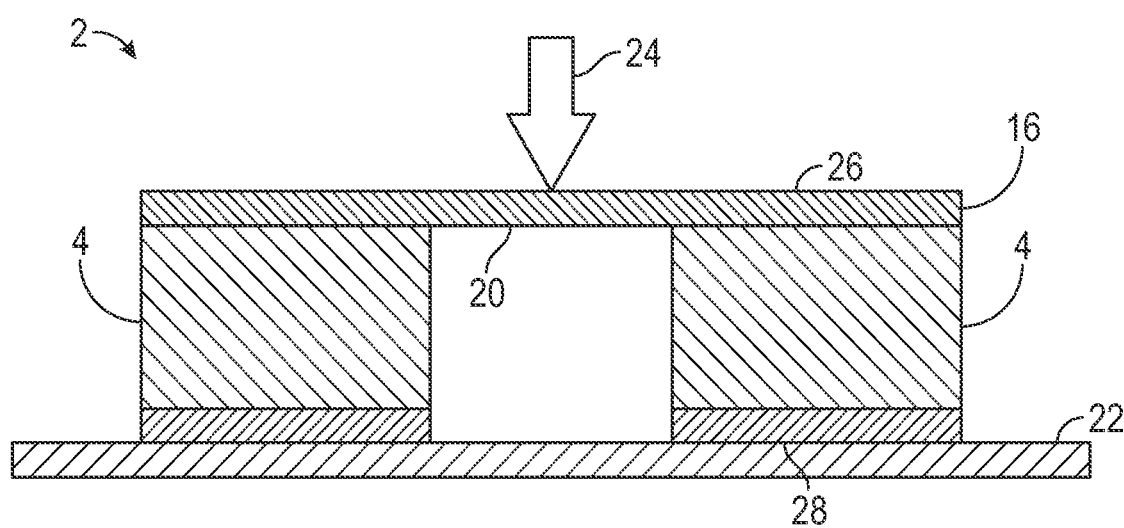
FIG. 4 is a side view of the substrate of FIG. 3 following demounting and mounting during jet ablation.

Referring to FIG. 4, the substrate 2 of FIG. 3 is illustrated after having been demounted from the original (first) tape 14 and mounted to a new tape 22 (which may be a picking tape in various implementations). As illustrated, the die 4 are still coupled together through at least the material of the passivation layer 16. In those implementations where the substrate has been only partially singulated or substantially singulated, some portion of the semiconductor material may also still couple the plurality of die together. For those implementations where an edge ring is used, the edge ring may still work to support the die 4 during the demounting and mounting process. In some implementations where an edge ring is employed and the substrate is being processed without being mounted to a backgrinding tape, the substrate may be flipped over and mounted without first being demounted following the etching step.

FIG. 4 illustrates a fluid jet 24 being applied to the location of the street 20 between the semiconductor die 40, causing the material of the passivation layer 16 (any other metal structures remaining in the street 20) to ablate away. While water may be used as being the liquid used for ablation, other fluids, gases, combinations of fluids, and combinations of fluids and gases may be employed in various method implementations.

While in various implementations and as illustrated in FIG. 4, the fluid jet 24 is applied to the passivation layer side (second side) 26 of the substrate 2 after the substrate 2 has been flipped over following etching of the substrate, in other implementations, the substrate 2 may not be flipped over and the fluid jet 24 may be applied to the street region to ablate away the material of the passivation layer from the back metal side (first side) 28 of the substrate. While the substrate 2 in FIGS. 2-4 is illustrated as having the full thickness 6 of the material of the substrate 2 etched through, in some implementations as previously discussed, a portion of the thickness of the substrate material may be left unetched to add sufficient strength to the substrate to allow it to be demounted, flipped over, and mounted. The jet ablation process may then be applied and used to remove the passivation material and the remaining material of the substrate in the street 20 as well. In some implementations, however, the substrate 2 may not be demounted and flipped over before application of jet ablation. In such implementations, it has been observed that the material of the passivation layer is driven into the tape and successfully separates the various die under the pressure of the fluid jet.

Figure 5:
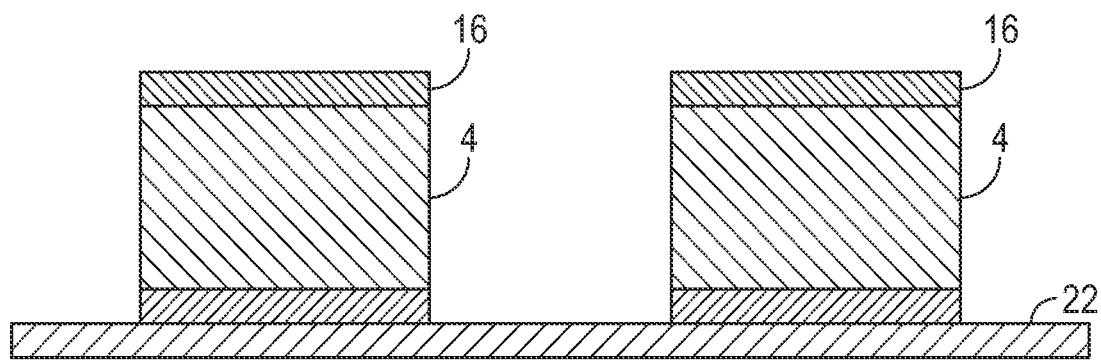
FIG. 5 is a side view of the two singulated die illustrated in FIG. 4 following ablation of the passivation layer.

Referring to FIG. 5, the semiconductor die 4 are illustrated following jet ablation of the passivation material 16. They may now be picked from the support tape 22 and prepared for subsequent packaging operations.

As illustrated in FIGS. 2 and 3, the patterned back metal is used as the patterning for the substrate etching process. Because of this, no additional photolithographic processing may be needed to carry out the substrate etching process. In some implementations, however, a photolithography step could be used to protect metal or other materials on the die during the jet ablation process. Also, because the material of the semiconductor substrate 2 works to guide the flow of the water during the water jet ablation process (i.e., through resisting the flow of fluid, the substrate material causes the passivation material to yield under the pressure of the fluid stream or focuses the energy of the fluid stream on the passivation material), no additional photolithographic steps may need to be carried out to facilitate the ablation process. This reduction in photolithographic steps reduces the number of total processing steps involving the wafer following the thinning process which can increase the overall yield of the process through reducing substrate breakage. Furthermore, because it is the jet ablation used to finish fully clearing out the street areas, no special designs (like drop out die and/or use of partial die) need to be added to the design, thereby increasing total die per wafer. Furthermore, no special street designs that include no electrical test or alignment features may need to be used to enable the plasma substrate etching process. Also, not using any saw singulating process may result in increase in good die and increases in die strength due to reductions in die chipping and cracking induced during sawing processes.

Figure 6:
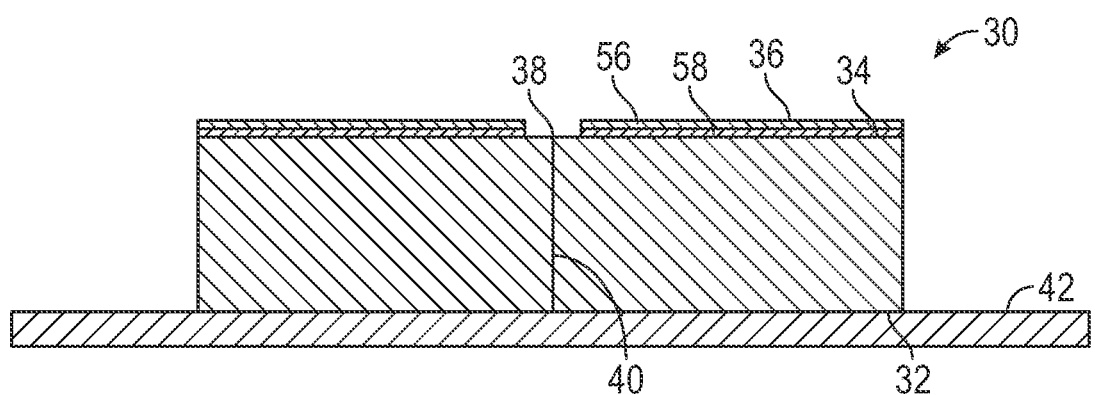
FIG. 6 is a side view of a semiconductor substrate implementation with an opening in a layer of passivation material coupled to a second side of the substrate.

Referring to FIG. 6, an implementation of a semiconductor substrate 30 is illustrated. As illustrated, the semiconductor substrate includes a semiconductor material in/on which a plurality of semiconductor die have been formed. The semiconductor substrate and the plurality of semiconductor die may be any substrate type or die type disclosed in this document. Furthermore, any of the substrate thicknesses disclosed in this document may be employed in various method implementations. The semiconductor substrate 30 has a first side 32 and a second side 34. On the second side 34, one or more layers of passivation material 36 are coupled/formed. In the implementation illustrated in FIG. 6, two layers 58, 56 of passivation material are illustrated. In various implementations, the material of each of the layers 58, 56 of passivation material may be the same material or different materials. As illustrated, an opening 38 has been formed in the layer of passivation material 36 in an area corresponding with a die street between two of the plurality of die indicated by line 40. The substrate 30 is also illustrated coupled to a tape/support 42.

Figure 7:
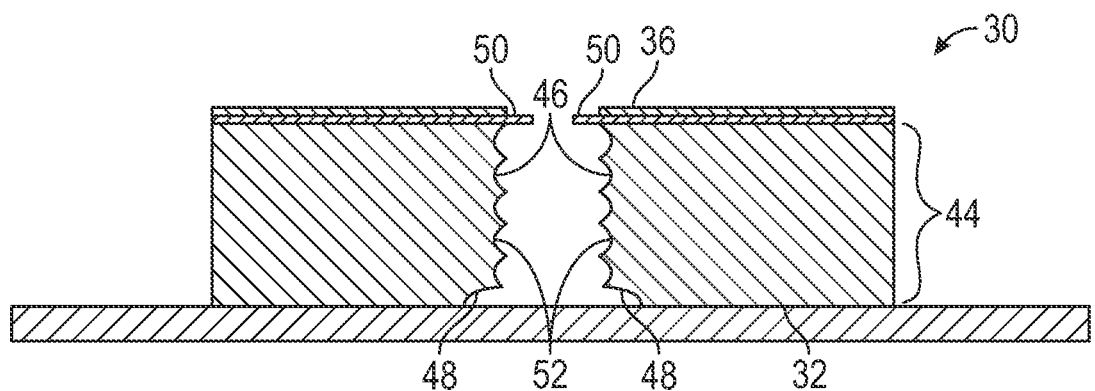
FIG. 7 is a side view of the semiconductor substrate implementation of FIG. 6 following etching.

Referring to FIG. 7, the semiconductor substrate 30 is illustrated following etching of the material of the semiconductor substrate through/across a thickness 44 of the substrate. In the implementation illustrated in FIG. 7, the etching process used is plasma etching. In this implementation, a deep reactive ion etching process has been used to etch through the thickness 44 as evidenced by the scalloped shapes 46 formed along the thickness/sidewalls of the plurality of die at the die street regions. In order to ensure that the full thickness of the semiconductor substrate is singulated across the entire largest planar surface of the substrate during etching, over etching of the substrate material is generally carried out to account for any etching uniformity issues observed. The effect of the over etching is to form a foot 48 into the material of the semiconductor substrate on the first side 32 of the substrate 30 and to cause the material of the substrate to recede under portions 50 of the passivation layer 36. As illustrated in FIG. 7, some of the materials of the passivation layer 36 may be more resistant to the plasma etching than others, particularly where multiple layers of different materials are used in the passivation layer 36. This is why only a portion of a bottom layer of the passivation layer 36 overhangs the sidewalls 52 in FIG. 7. In other implementations however, the entire thickness of the passivation layer 36 may overhang the sidewalls 52.

In some implementations where multiple layers are included in the passivation layer 36 the upper layer 56 may be intentionally pulled back through etching or patterning in the die street regions to leave the lower layer 58 exposed to ensure that just the lower layer of the passivation layer 36 overhangs the sidewalls 52. By non-limiting example, if the upper layer 56 of the passivation material 36 was a nitride, the nitride may be patterned and etched to expose the lower layer 58 like a polyimide during the etching step. A wide variety of ways of pulling back, patterning, or otherwise leaving various layers of the passivation to improve the performance of methods of singulating the semiconductor substrate like those disclosed herein may be constructed using the principles in this disclosure.

In implementations where a wet etching process is employed to etch through the thickness 44 of the substrate 30, the sidewalls 52 at the plurality of die may not include the scalloped shapes 46 but may be curved and similarly receded underneath the material of the passivation layer 36. This is because the material of the passivation layer 36 does not wet etch at the same rate as the material of the particular semiconductor substrate 30. In wet etch implementations, no foot 48 may be formed at the material of the semiconductor substrate. In such implementations, the sidewalls 52 will still recede underneath the layer of passivation material 36 during etching causing portions of the passivation layer 36 to overhang the sidewalls 52.

In various method implementations disclosed herein, while the use of the passivation material as an etching mask during etching of the semiconductor substrate 30 across the thickness 44 is illustrated, in other implementations, a backmetal may be patterned and used as the etch mask during the etching step. In these implementations, any of the methods of forming backmetal, patterning backmetal, and using backmetal as a mask to etch through the material of the substrate 30 disclosed in this document may be utilized. Because of this, in the various method implementations disclosed herein, passivation material 36 may be alternatively coupled to the tape 42 directly or coupled above the tape as illustrated in FIG. 6

A challenge posed by the portions 50 of the passivation material 36 that overhang the sidewalls 52 is that during subsequent processing operations the overhanging portions 50 may cause chipping during shipment, lifting and/or peeling of the passivation layer 36 during shipment, or generation of flakes and particles of passivation material/semiconductor substrate during subsequent processing. These issues may cause various failures and/or defects in the plurality of die or packages formed using the plurality of die. Various methods of removing the portions 50 of the passivation material 36 will be discussed in this document.

Figure 8:
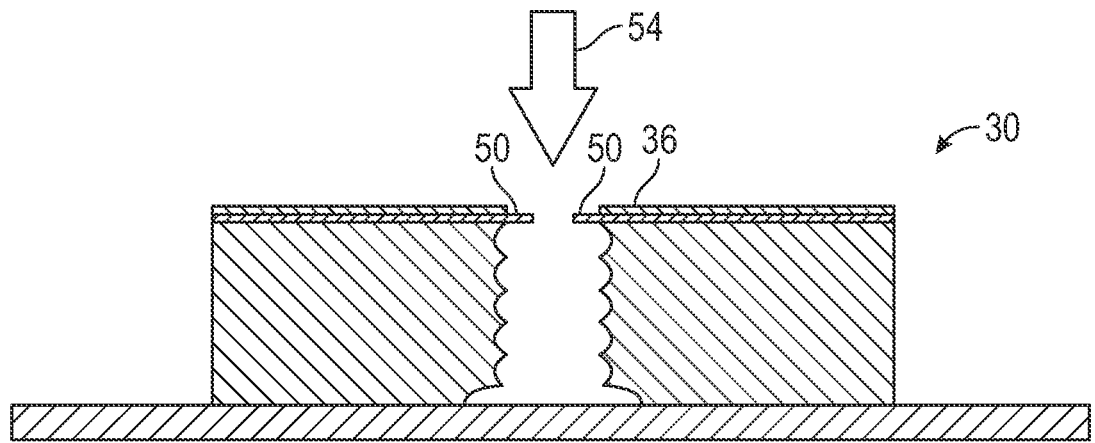
FIG. 8 is a side view of the semiconductor substrate implementation of FIG. 7 during jet ablation.
Figure 9:
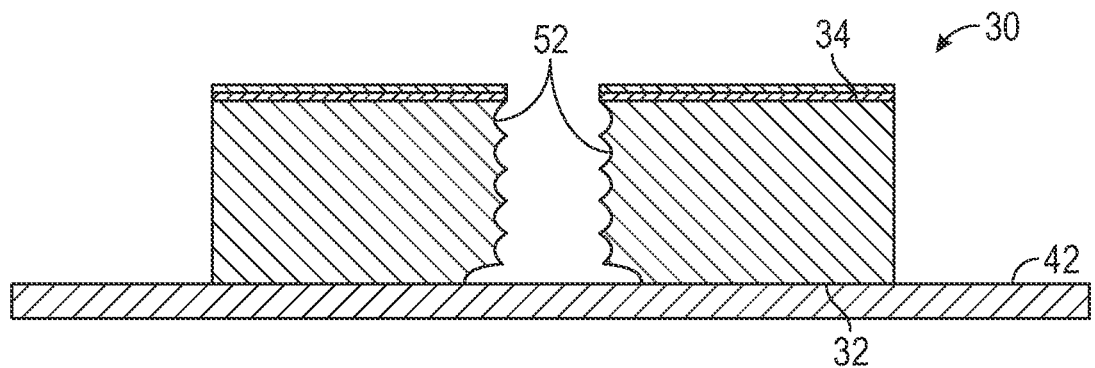
FIG. 9 is a side view of the substrate implementation of FIG. 8 following jet ablation.

Removal of the portions 50 of the passivation material 36 in the method implementations disclosed herein is carried out through the use of jet ablation. Referring to FIG. 8, the substrate 30 of FIG. 7 is illustrated as jet ablation 54 is being carried out against the portions 50 of the passivation layer 36. The particular jet ablation process used in various method implementations disclosed herein may be any disclosed in this document. FIG. 9 illustrates the substrate 30 after the completion of jet ablation 54 indicating that the portions 50 that overhang the sidewalls 52 have been removed. At this point, the plurality of die are ready for subsequent picking from the tape 42 and for subsequent processing operations without the issues relating to the overhanging portions 50 of the passivation material being an issue.

While in the method implementation illustrated in FIGS. 6-9 jet ablating from the second side 34 of the substrate 30 is illustrated, in other implementations jet ablation may be carried out from the first side 32 of the substrate 30. In such implementations, the material of the passivation layer 36 may be directly coupled with the tape 42 and the material of the passivation layer has an opening formed therethrough during the etching process. Because the material of the passivation layer 36 generally does not etch at the same rate as the material of the semiconductor substrate 30, overhanging portions of the passivation layer 36 will be formed on either side of/around the opening. Following the etching, jet ablating is then used to remove the overhanging portions of the passivation layer 36. In these implementations, no foot may be observed to be formed against the tape 42 but may be present against the material of the passivation layer due to the over etching. In these implementations, because the etching step forms an opening all the way through the one or more layers of the passivation layer, portions of the overhanging material may still be attached to the plurality of die following singulation and cause flaking and the other processing issues previously noted. Being able to use jet ablating to remove the overhanging portions prior to subsequent processing where the jet ablating comes from the first side 32 of the substrate 30 may have the same benefits observed as in the method implementations illustrated in FIGS. 6-9. Many other possible method variations may be constructed using the principles disclosed herein.

In various method implementations, the use of jet ablating to remove overhanging portions of the passivation material may also be used to remove, by non-limiting example, various electrical test structures, probing structures, structural testing structures, alignment structures, or other residual structures remaining in the die street region following etching. The ability to remove these various structures using jet ablating may be useful when plasma etching is employed, as plasma etching can be particularly selective to the material of the semiconductor substrate itself leaving these structures behind.

In places where the description above refers to particular implementations of jet ablation systems and related methods and implementing components, sub-components, methods and sub-methods, it should be readily apparent that a number of modifications may be made without departing from the spirit thereof and that these implementations, implementing components, sub-components, methods and sub-methods may be applied to other jet ablation systems and related methods.

What is claimed is:

1. A method of singulating a plurality of semiconductor die, the method comprising:
    forming an opening in a layer of passivation material coupled to a second side of a semiconductor substrate;
    etching substantially through a thickness of the semiconductor substrate at the opening in the layer of passivation material to form etched sidewalls along the thickness at a plurality of die streets; and
    jet ablating one or more portions of the layer of passivation material that overhangs the etched sidewalls.

2. The method of claim 1, wherein forming an opening in the layer of passivation material further comprises one of etching or jet ablating.

3. The method of claim 1, wherein jet ablating one or more portions of the layer of passivation material further comprises jet ablating from the second side of the semiconductor substrate.

4. The method of claim 1, wherein jet ablating one or more portions of the layer of passivation material further comprises jet ablating from the first side of the semiconductor substrate.

5. The method of claim 1, wherein etching substantially through the thickness of the semiconductor substrate further comprises plasma etching.

6. The method of claim 1, wherein the thickness of the semiconductor substrate is less than 50 microns.

7. The method of claim 1, wherein the thickness of the semiconductor substrate is 25 microns.

8. The method of claim 1, further comprising jet ablating one or more portions of the layer of passivation material after etching substantially through the thickness of the semiconductor substrate.

9. A method of singulating a plurality of semiconductor die, the method comprising:
- forming a pattern in a back metal layer coupled on a first side of a semiconductor substrate, the semiconductor substrate comprising a plurality of semiconductor die;
- etching substantially through a thickness of the semiconductor substrate at the pattern in the back metal layer to form a plurality of sidewalls across the thickness;
- etching substantially through a thickness of a passivation layer coupled to a second side of the semiconductor substrate at the pattern in the back metal layer to form an opening in the passivation layer; and
- jet ablating one or more portions of the passivation layer overhanging the plurality of sidewalls.

10. The method of claim 9, wherein jet ablating one or more portions of the passivation layer further comprises jet ablating from the second side of the semiconductor substrate.

11. The method of claim 9, wherein jet ablating one or more portions of the passivation layer further comprises jet ablating from the first side of the semiconductor substrate.

12. The method of claim 9, wherein etching substantially through the thickness of the semiconductor substrate further comprises plasma etching.

13. The method of claim 9, wherein the thickness of the semiconductor substrate is less than 50 microns.

14. The method of claim 9, wherein the thickness of the semiconductor substrate is 25 microns.

15. The method of claim 9, further comprising jet ablating one or more portions of the passivation layer after forming the opening in the passivation layer.

16. A method of singulating a plurality of semiconductor die, the method comprising:
- mounting a semiconductor substrate to a tape;
- etching substantially through a thickness of the semiconductor substrate at a plurality of die streets to form etched sidewalls along the thickness; and
- jet ablating one or more portions of a layer of passivation material that overhangs the etched sidewalls;
- wherein the layer of passivation material is used as a mask for etching substantially through the thickness of the semiconductor substrate.

17. The method of claim 16, wherein etching substantially through the thickness further comprises plasma etching.

18. The method of claim 16, wherein jet ablating one or more portions of the layer of passivation material further comprises jet ablating from a second side of the semiconductor substrate.

19. The method of claim 16, wherein jet ablating one or more portions of the layer of passivation material further comprises jet ablating from a first side of the semiconductor substrate.

* * * * *